United States Patent
Zimmermann

(10) Patent No.: US 10,644,180 B2
(45) Date of Patent: May 5, 2020

(54) SOLAR CELL AND SOLAR CELL ASSEMBLY

(71) Applicant: ASTRIUM GMBH, Taufkirchen (DE)

(72) Inventor: Claus Zimmermann, München (DE)

(73) Assignee: AIRBUS DEFENCE AND SPACE GMBH, Taufkirchen (DE)

( * ) Notice: Subject to any disclaimer, the term of this patent is extended or adjusted under 35 U.S.C. 154(b) by 219 days.

(21) Appl. No.: 15/297,856

(22) Filed: Oct. 19, 2016

(65) Prior Publication Data
US 2017/0040482 A1 Feb. 9, 2017

Related U.S. Application Data

(63) Continuation of application No. 13/544,469, filed on Jul. 9, 2012, now Pat. No. 9,508,876.

(30) Foreign Application Priority Data

Jul. 12, 2011 (EP) ..................................... 11005666

(51) Int. Cl.
*H01L 31/05* (2014.01)
*H01L 27/142* (2014.01)
(Continued)

(52) U.S. Cl.
CPC ...... *H01L 31/0508* (2013.01); *H01L 27/1421* (2013.01); *H01L 31/022425* (2013.01);
(Continued)

(58) Field of Classification Search
None
See application file for complete search history.

(56) References Cited

U.S. PATENT DOCUMENTS

| 3,527,619 A | 9/1970 | Miley |
| 6,248,948 B1 | 6/2001 | Nakagawa et al. |

(Continued)

FOREIGN PATENT DOCUMENTS

| DE | 10 2007 011403 | 9/2008 |
| EP | 1 030 376 | 8/2000 |

(Continued)

OTHER PUBLICATIONS

English Translation of Lockenhoff (accessed Jun. 2018).*

(Continued)

*Primary Examiner* — Shannon M Gardner
(74) *Attorney, Agent, or Firm* — Greenblum & Bernstein, P.L.C.

(57) ABSTRACT

Solar cell assembly that includes at least first and second solar cells arranged adjacent each other to form a row. First electric contact pad of first solar cell is positioned adjacent to second electric contact pad of second solar cell and second electric contact pad of first solar cell is positioned adjacent to first electric contact pad of second solar cell. Interconnectors connect each first electric contact pad of first solar cell with adjacent second electric contact pad of second solar cell and each second electric contact pad of first solar cell with adjacent first electric contact pad of second solar cell. Each interconnector is sized so that, between adjacent cells, interconnector is below first electric contact pad. Cover glass is provided on a front surface of each solar cell, and each interconnector is provided with a cover member covering a front surface of interconnector.

14 Claims, 7 Drawing Sheets

(51) Int. Cl.
*H01L 31/0224* (2006.01)
*H01L 31/048* (2014.01)
*H01L 31/0687* (2012.01)
*H01L 31/0304* (2006.01)

(52) U.S. Cl.
CPC ........ *H01L 31/048* (2013.01); *H01L 31/0504* (2013.01); *H01L 31/0516* (2013.01); *H01L 31/0687* (2013.01); *H01L 31/0304* (2013.01); *Y02E 10/50* (2013.01); *Y02P 70/521* (2015.11)

(56) References Cited

U.S. PATENT DOCUMENTS

| | | |
|---|---|---|
| 6,262,358 B1 | 7/2001 | Kamimura et al. |
| 8,187,907 B1 | 5/2012 | Newman |
| 2001/0023702 A1 | 9/2001 | Nakagawa et al. |
| 2002/0144724 A1 | 10/2002 | Kilmer et al. |
| 2006/0180198 A1 | 8/2006 | Takamoto et al. |
| 2010/0089435 A1 | 4/2010 | Lockenhof |
| 2011/0100412 A1 | 5/2011 | Clevenger et al. |
| 2012/0037203 A1 | 2/2012 | Sainoo et al. |

FOREIGN PATENT DOCUMENTS

| | | |
|---|---|---|
| EP | 1 693 899 | 8/2006 |
| WO | 99/60606 | 11/1999 |
| WO | 99/62125 | 12/1999 |
| WO | 2010/116973 | 10/2010 |

OTHER PUBLICATIONS

Europe Office Action conducted in counterpart Europe Appln. No. 11 005 666.0—1230 (dated Apr. 18, 2018).

Zimmermann, "Utilizing lateral current spreading in multijunction solar cells: An alternative approach to detecting mechanical defects," Journal of Applied Physics, vol. 100, No. 023714 (2006).

\* cited by examiner

SOLAR CELL AND SOLAR CELL ASSEMBLY

CROSS-REFERENCE TO RELATED APPLICATIONS

The present application is a Continuation of U.S. application Ser. No. 13/544,469 filed Jul. 9, 2012 and claims priority under 35 U.S.C. § 119(a) of European Patent Application No. 11 005 666.0-1528 filed Jul. 12, 2011, the disclosures of which are expressly incorporated by reference herein in their entireties.

BACKGROUND OF THE INVENTION

1. Field of the Invention

The present invention is directed to a solar cell having a front surface and a rear surface, in which a first p-n-junction is provided in the substrate close to a front surface to separate the substrate into a front portion having a first doping and a rear portion having a second doping. A front layer including a further p-n-junction is provided on the front surface of the substrate to separate the front layer into a front portion having the first doping and a rear portion having the second doping and wherein said front layer front portion is separated from the substrate front portion. At least one first electric contact is provided on the front side of the solar cell and electrically connected to the front portion of the front layer and at least one second electric contact, which is provided on the rear side of the solar cell is electrically connected to a contact point provided on the front side of the solar cell. It is further directed to a solar cell assembly of such solar cells and to a method of manufacturing a solar cell assembly, 2. Discussion of Background Information Embodiments of the present invention include a new efficient method to manufacture a solar cell with electrical contacts of both polarities on the front surface, improved design features for a spatial arrangement of a plurality of this type of solar cells into a photovoltaic assembly as well as an automated manufacturing flow possible with this arrangement. The features of these embodiments, which are mainly focused on solar cell and solar cell assemblies for space use, but not necessarily limited to it, will become evident in a comparison with the prior art.

For power generation in space, multi-junction solar cells based on III-V semiconductors with current efficiencies between 25-30% are used. Further efficiency increase is likely to occur with adapted designs in the future.

A cross section through a prior art triple junction (TJ) cell is illustrated in FIG. 1. The vertical dimensions are not to scale and laterally the cell extends further to the right.

In such a triple junction solar cell design, three p-n-junctions 1, 2, 3 are stacked on top of each other, such that the band gap of the semiconductor materials constituting the junctions decreases from the top to the bottom of the cell. A Germanium wafer 4, typically 80-150 µm thick, serves as the substrate of the cell. A p-n-junction 3 is created, some µm from the wafer front surface by diffusion. On top of the wafer, two more p-n-junctions 1, 2 are grown from III-V semiconductor materials. It is implicitly understood here as well as in the following that tunnel junctions are included between each p-n-junction. In addition, several additional layers functioning for example as back surface fields, buffer layers, reflectors are included in the actual device. These however, are not relevant in the frame of this invention and are therefore neither referenced in FIG. 1 nor in the following. The top most cell layer is passivated on the surface by a transparent window layer 5. In this configuration the three p-n-junctions are located within a depth of approximately 10 µm from the cell surface.

The cell shape has then to be isolated from usually circular Germanium wafer and the epitaxially grown junctions on top of it. The cell circumference is defined by etching a so called "mesa" groove 6, sufficiently deep (e.g. 10 µm in this example) to separate all three p-n-junctions. The remaining electrically inactive Germanium wafer is then separated mechanically by dicing, i.e. by sawing along a cut line 7.

Then electrical contacts have to be applied to the cell. The rear side contact 8 is usually completely metalized with any metal system able to form an ohmic contact to the cell. The front side contact 9 is produced similarly. Due to the fact, however, that light has to enter the cell from the front, the front side contact is shaped in the form of narrow grid fingers 100 (FIG. 2), which are connected among each other and finally to a number of front side contact pads 10 used for the external cell connection. A typical layout is illustrated in FIG. 2.

Underneath the front side grid another doped semiconductor layer is present, the so called cap layer 11, primarily to serve as additional protection of the cell during attachment of external electrical connections on the contact pads 10 by methods such as soldering or welding. To minimize light reflections, an antireflection coating 12 is deposited on the cell front side.

It is immediately obvious and can be seen in FIG. 3 that for these epitaxially grown cells 200 the two electrical cell contacts are located on different cell surfaces. For simplicity, the back contact is referred to as the (+) contact in the following, whereas the (−) contact is on the front. Since the output of a single cell, e.g. 0.5 A at 2.3 V for the cells outlined above, is incompatible with the requirements of the power subsystem, these cells have to be connected in series and in parallel to increase the output voltage and current as shown in FIG. 3.

The primary element for solar arrays in space is a connection of typical 30 or 60 cells in series for required bus voltages of 50 or 100 V. Several of these elements, called "strings" are then connected in parallel at their ends with the inclusion of blocking diodes to sections and deliver currents around 10 A. The strings are placed on a common insulating substrate 201. Together with the electrical parallel connection of the strings this forms the photovoltaic assembly (PVA). Solar arrays for space use are for example sandwich panels with a carbon fiber face sheet and an aluminum honeycomb core with a Kapton front side insulation. These substrates have large thermal expansion mismatch relative to the cells. During eclipse phases with temperature fluctuations up to 200° C. the gap 202 between two cells varies by several 10 µm, exposing any electrical connection between two cells to significant cyclic stress. To cope with this, it is state of the art to use 10-20 µm thick metal foils like Silver (Ag), Gold (Au), silver-plated Molybdenum (Mo), silver-plated nickel-cobalt ferrous alloy (e.g. known under the trademark "Kovar" and having a low coefficient of thermal expansion), etc. to bridge the gap between two cells.

With the electrical cell contacts on opposite sides in the prior art embodiments, the electrical series connection naturally has to be performed from the front side contact pad 10 of one cell to the rear side 203 of the adjacent cell. To minimize the stresses induced into the interconnector material due to the thermally induced gap variation, the interconnector 204 is S-shaped, protruding significantly above the cell.

Another important consideration in this stringing operation is directed to reverse voltages. For individual cells in a string operating conditions can occur, where particular cells are exposed to a reverse voltage. III-V multi-junction cells, however, can only tolerate a limited reverse voltage. Each cell thus has to be protected from excessive reverse voltage by a diode of opposite polarity compared to the cell which is connected in parallel.

There are several concepts to achieve this, for example growing a diode of opposite polarity separately on a part of the cell surface. The befit of these diode designs is that they are easily connected, e.g. only a connection to the neighboring front side contact pad has to be made. These diodes protect the cell they are grown on. It will become clear in the following that the cells with this type of diodes do not require any additional diode related consideration in the frame of this invention and are therefore not discussed further.

The drawback of these monolithically grown diodes is that they require several additional growth steps during cell manufacturing, which makes the cell considerably more expensive.

Another diode concept frequently used is much simpler to implement, but more complicated to interconnect. A limited area of the cell 101, as shown in FIG. 2, preferably at the cell edge, is electrically isolated by a mesa groove etch 6, which separates all three junctions. This cell area is thus electrically isolated from the rest of the cell, only contacted to the (+) polarity of the cell. By depositing a metal contact 102 on top of it, a (−) contact is provided. Optionally several of these diode p-n-junctions can be etched away to reduce the diode voltage. Due to the fact that the diode created out of cell material in this fashion has the same polarity as the cell, it cannot protect the cell it is located in. Rather an electrical connection has to be made by another S shaped interconnector 205 from the front side contact of the diode 102 to the rear side 206 of the neighboring cell.

To limit radiation damage of the cells in space, all active cell and diode areas should be shielded. Usually a 100 µm thick cerium doped cover glass 207 is used. These are bonded with transparent silicone adhesive 208 to the cell front side. Another silicone adhesive 209 is used for bonding the cells onto the substrate 201. Based on this photovoltaic assembly (PVA) design it is obvious for persons skilled in the art that the manufacturing flow has to involve different steps of manufacturing subassemblies and is hard to fully automate.

Usually the interconnectors of diode and cell are welded to the cell first. Then the cover glass is bonded onto the cell to form a cover integrated cell (CIC). These steps are usually fully automated. Then the CICs have to be positioned with the cover glass facing downwards onto a suitable welding plate and the diode and power interconnectors have to be aligned on the appropriate cell rear side, which is a cumbersome manual process. Note that diode and power interconnectors go to the rear side of different cells. Then all rear side interconnections are performed, again automatically, e.g. by welding.

All subsequent manufacturing steps are then again performed manually. The string of cells created in this way is turned upside down again, by affixing it to a temporary transport plate. Then it is placed with the cover glass front side onto an adhesive foil, which supports the strings during the lay down process. For lay down, a room temperature curing silicone adhesive is applied onto the cell rear side, for example by screen printing, which assures a well defined adhesive thickness. Within the appropriate window of the adhesive's viscosity time curve, the strings are placed onto the support structure. During curing, pressure is applied onto the cells by enclosing the cell in an appropriate fashion and evacuating this area. After complete curing of the adhesive, the self adhesive foil is removed from the front side of the CICs.

It is obvious that this process is very complicated and time consuming and requires several steps that have to be carried out manually.

SUMMARY OF THE EMBODIMENTS

Embodiments of the present invention provide a solar cell which can be easily manufactured and which allows an easy and economic manufacturing process of solar cell assemblies. The term solar cell assembly denotes a spatial arrangement of a plurality of solar cells or CICs, i.e. solar cells equipped with interconnector and cover glass.

In accordance with embodiments, in the solar cell the at least one contact point is placed on a bottom surface of a groove that opens to the front side of the solar cell and which extends to the rear portion of the substrate, and an electrical connection between the at least one second electric contact and the at least one contact point is provided by the rear portion of the substrate.

Placing an electric contact point which is electrically connected to the second electric contact through the rear portion of the substrate on the bottom surface of the groove according to the features of the characterizing portion of claim 1 so that the contact point of the second electric contact is facing to the front side of the solar cell makes the contacts of both polarities accessible from the front side of the solar cell so that contact bonding steps during the manufacturing process of a solar cell array of such an inventive solar cell can be carried out without turning the solar cell. This reduces the handling steps during the manufacturing process and thus accelerates the manufacturing process of a solar cell assembly. Furthermore, the contacts of both polarities of the solar cells in a solar cell assembly are accessible from the front side so that testing and repairing of single solar cells in a solar cell assembly is made very easy.

In a preferred embodiment at least one intermediate layer comprising a p-n-junction is provided between said substrate and said front layer wherein said p-n-junction separates the at least one intermediate layer into a front portion having said first doping and a rear portion having said second doping and wherein said intermediate layer front portion is separated from said substrate front portion. Such a multi-layer solar cell is more efficient.

Preferably, said groove is provided on a lateral side of the solar cell so that it also opens to the lateral side. This embodiment allows a lateral contacting of the solar cell.

Further preferred embodiments are characterized in that the front surface of the front layer is at least partially provided with an antireflection coating. Additionally or alternatively said bottom surface of the groove is provided around a contact pad of said second electric contact point at least partially with an antireflection coating. These antireflection coatings are provided to minimize light reflections.

Preferably, said solar cell is a III-V triple junction cell wherein said substrate is a Germanium wafer.

It is particular advantageous when a cover glass is provided on the front surface of the front layer and said cover glass is provided with cut-outs at the positions of the second electric contact point, the cut-outs having preferably the same size as a contact pad of the electric contact. The provision of this cover glass limits radiation damage of the cells when the solar cell is used in space.

Embodiments of the present invention are directed to the solar cell assembly that includes at least two interconnectable solar cells that can be arranged to form a row of solar cells and alternatively are directed to the solar cell assembly of at least three interconnectable solar cells that can be arranged to form an array of solar cells.

According to a first version of the above-noted solar cell assembly, first and second electric contact pads of the first and second electric contacts, respectively, of each solar cell are positioned so that a first electric contact pad of a first solar cell is placed close to a second electric contact pad of an adjacent solar cell and a second electric contact pad of said first solar cell is placed close to a first electric contact pad of said adjacent solar cell when said solar cells form a row of solar cells.

In the second, alternative version of the above-noted solar cell assembly, the first and second electric contacts pads of the first and second electric contacts, respectively, of each solar cell are positioned so that a first electric contact pad of a first solar cell is placed close to a second electric contact pad of an adjacent solar cell and a second electric contact pad of said first solar cell is placed close to a first electric contact pad of said adjacent solar cell when said solar cells form an array of solar cells;

In both versions interconnectors are provided to connect each first electric contact pad of said first solar cell with the adjacent second electric contact pad of said adjacent solar cell and to connect each second electric contact pad of said first solar cell with the adjacent first electric contact pad of said adjacent solar cell and the size of each interconnector is such that no element of the interconnector protrudes from the front surfaces of the solar cells connected by said interconnector.

This particular provision of the first and second contact pads of the electric contacts of the solar cells which are all accessible from the front side thereof and the size of each interconnector such that no element of the interconnector protrudes from the front surfaces of the solar cells connected by the interconnector leads to a solar cell assembly in which the cell to cell interconnectors are completely protected from mechanical damage during all solar array manufacturing and cleaning steps.

In a preferred embodiment said interconnectors are formed in U-shape or W-shape configuration. Such a bent interconnector is able to compensate thermal extensions.

Preferably each interconnector comprises a plurality of grid fingers, each of which is contacted separately to the associated electric contact pad. This type of connector provides redundancy against disconnection because each grid finger is connected separately to the associated contact pad.

Preferably, in a solar cell assembly wherein a cover glass is provided on the front surface of the front layer each interconnector is provided with a cover member covering the front surface of the interconnector. This feature protects also the connector region against ion erosion (sputtering) from ion thrusters.

It is very advantageous when the cover member is mounted to the interconnector in a flexible manner. This will allow a relative lateral movement of the cover member and the interconnector in case of thermal expansion of the cells.

In another preferred solar cell assembly according to the invention, wherein a cover glass is provided on the front surface of the front layer of each solar cell, the front surface of said cover glass is provided with a conductive coating which is connected to a metalized portion of a side wall of the cover glass adjacent to the groove accommodating one of the second electric contact pads and said metalized portion is electrically connected to said first electric contact pad. This embodiment provides an easy and safe way of grounding the conductive coating of the cover glass.

Preferably the free end of the interconnector is bent towards the front side of the solar cell (e.g. upwardly bent), and the bent portion of the interconnector electrically contacts the metalized portion of the side wall when the interconnector is fixed to said electric contact pad. It is also advantageous when the bent portion of the interconnector is formed with grid fingers at the free end thereof. This design provides redundancy as at least one of the grid fingers needs to be in contact with the metalized portion. The bent portion is integrally formed in the region of the elbow-like bending and connects the grid fingers of the bent portion and, if so provided, also the grid fingers which are provided to be contacted to the contact pad.

Embodiments are directed to the manufacturing method of a solar cell assembly. This method comprises the steps of
a) providing a solar cell;
b) applying an adhesive, preferably a vulcanizing silicone adhesive, to the rear side of the solar cell, at least at positions underneath all front side contact pads;
c) placing the solar cell with the rear side thereof onto a support structure;
d) curing the adhesive by applying heat and or pressure onto the support structure with the solar cell placed thereon;
e) repeating steps a) to d) with another solar cell which is placed in step c) so that associated contact pads which are to be interconnected are positioned close to one another;
f) placing and welding the interconnectors in order to connect associated contact pads;
g) repeating steps e) and f) until the desired number of solar cells is mounted to the support structure and electrically interconnected.

This inventive manufacturing method for a solar cell assembly allows fast and reliable automatic manufacturing of the solar cell assembly.

Dividing step d) into two sub-steps of
d1) first curing the adhesive at the positions underneath all front side contact pad locations;
d2) thereafter curing the adhesive at remaining adhesive positions,
and providing an additional step of testing the mechanical and/or electrical integrity of the solar cell between step d1) and step d2) allows carrying out a testing step before the solar cell is completely fixed to the support structure. In case a failure is detected in the tested solar cell, the solar cell can be easily removed and replaced by another solar cell because the adhesive at the remaining adhesive positions is not cured and is thus still flexible.

It is further advantageous when after step g) a cover glass is placed over the plurality of solar cells and is mounted to the support structure and/or to the solar cells. This method step is preferably carried out when the solar cell assembly is provided for space use.

Embodiments of the invention are directed to a solar cell, the solar cell including a semiconductor substrate having a substrate front surface and a substrate rear surface. A first p-n-junction is provided in the substrate close to the substrate front surface, and the first p-n-junction separates the substrate into a substrate front portion having a first doping and a substrate rear portion having a second doping. A front layer includes a further p-n-junction provided on the substrate front surface of the substrate, and the further p-n-junction separates the front layer into a further front portion having the first doping and a further rear portion having the second doping, and the further front portion is separated from the substrate front portion. At least one first electric contact is provided on a front side of the solar cell that is electrically connected to the further front portion, and at least one second electric contact is provided on a rear side of the solar cell that is electrically connected to at least one contact point provided on the front side of the solar cell. The at least one contact point is placed on a bottom surface of a groove that opens to the front side of the solar cell and which extends to the rear portion of the substrate, and an electrical connection between the at least one second electric contact and the at least one contact point is provided by the rear portion of the substrate.

According to embodiments, the solar cell may further include at least one intermediate layer comprising a p-n-junction provided between the substrate and the front layer. The intermediate p-n-junction separates the at least one intermediate layer into an intermediate front portion having the first doping and an intermediate rear portion having the second doping, and the intermediate front portion is separated from the substrate front portion.

In accordance with other embodiments, the groove can be provided on and be open to a lateral side of the solar cell.

The solar cell can also include at least one of an antireflection coating at least partially provided on the further front surface of the further front layer; and at least one contact pad for the at least one contact point on the bottom surface of the groove, in which the bottom surface having an antireflection coating at least partially around the at least one contact pad.

According to still other embodiments of the present invention, the solar cell can be a III-V triple junction cell and the substrate may be a Germanium wafer.

Moreover, the solar cell can further include a cover glass provided on the further front surface, and the cover glass can be provided with cut-outs at positions of the at least one contact point. The cut-outs can have a same size as a contact pad for an electric contact.

In accordance with still other embodiments, a solar cell assembly including at least two interconnectable solar cells, as described above, can include first and second electric contact pads for respective first and second electric contacts for each solar cell. A first electric contact pad of a first solar cell can be positioned adjacent to a second electric contact pad of another solar cell and a second electric contact pad of the first solar cell can be positioned adjacent to a first electric contact pad of the another solar cell, and the first and second solar cells may be arranged to form a row of solar cells. Interconnectors can be arranged to connect each first electric contact pad of the first solar cell with the adjacent second electric contact pad of the another solar cell and to connect each second electric contact pad of the first solar cell with the adjacent first electric contact pad of the another solar cell. Each interconnector may be sized so that no part of the interconnector protrudes from the front surfaces of the first and another solar cells connected by the interconnector.

According to other embodiments of the instant invention, a solar cell assembly of at least three interconnectable solar cells, as described above, may include first and second electric contacts pads for respective first and second electric contacts for each solar cell. A first electric contact pad of a solar cell can be positioned adjacent to a second electric contact pad of another solar cell and a second electric contact pad of the solar cell can be positioned adjacent to a first electric contact pad of the another solar cell, and the solar cells may be arranged to form an array of solar cells. Interconnectors can be arranged to connect each first electric contact pad of the solar cell with the adjacent second electric contact pad of the another solar cell and to connect each second electric contact pad of the solar cell with the adjacent first electric contact pad of the another solar cell. Each interconnector may be sized so that no part of the interconnector protrudes from the front surfaces of the solar cells connected by the interconnector.

Moreover, the interconnectors can be formed in a U-shaped or a W-shaped configuration. Also, at least one free end of the interconnector can be bent upwardly away from an associated electric contact pad and distant from a sidewall of the groove. Further, each interconnector can include a plurality of grid fingers, each of which is contacted separately to the associated electric contact pad. The solar cell assembly can further include a cover glass provided on the further front surface of the front layer, in which each interconnector is provided with a cover member covering a front surface of the interconnector. The cover member can be mounted to the interconnector in a flexible manner. Still further, a cover glass can be provided on the further front surface of the front layer of each solar cell, such that a front surface of the cover glass is provided with a conductive coating that is connected to a metalized portion of a side wall of the cover glass adjacent to the groove accommodating one of the contact pads, and the metalized portion is electrically connected to the first electric contact pad. A free end of the interconnector can be bent towards the front side of the solar cell, and the bent portion of the interconnector electrically may contact the metalized portion when the interconnector is fixed to the electric contact pad. The bent portion can form grid fingers at free ends.

According to still other embodiments, a method of manufacturing the solar cell assembly, as described above, can include applying an adhesive to the rear side of the solar cell, and at least at positions underneath all front side contact pad locations; placing the rear side of the solar cell onto a support structure; curing the adhesive by applying heat and or pressure onto the support structure with the solar cell placed thereon; applying an adhesive to the another solar cell, at least at positions underneath all front side contact pad locations, placing the rear side of the another solar cell onto the support structure so that associated contact pads of the solar cell and the another solar cell to be interconnected are positioned close to one another and curing the adhesive; and placing and welding the interconnectors to connect the associated contact pads.

In accordance with still yet other embodiments of the present invention, the adhesive may include a vulcanizing silicone adhesive. Further, the curing can include first curing the adhesive at the positions underneath all front side contact pad locations and, after the first curing, curing the adhesive at remaining adhesive positions. Between the first curing and the curing after the first curing, the method further may also include testing at least one of mechanical and electrical integrity of the solar cell. Moreover, the method can also include placing a cover glass over the plurality of solar cells and mounting the glass cover at least one of to the support structure and to the solar cells.

Other exemplary embodiments and advantages of the present invention may be ascertained by reviewing the present disclosure and the accompanying drawing.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 4:
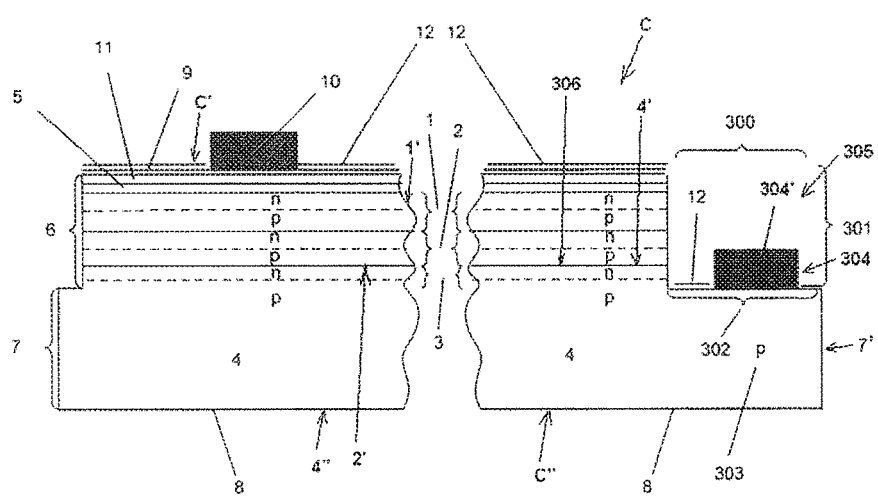
FIG. 4 shows a cross sectional view through a solar cell according to the invention.

The solar cell C shown in FIG. 4 is made of a semiconductor substrate 4 having a front surface 4' and a rear surface 4". A first p-n-junction 3 is provided in the substrate 4 close to the front surface 4' thereof. The p-n-junction 3 separates the substrate into a front portion having a first doping n and a rear portion having a second doping p.

Figure 1:
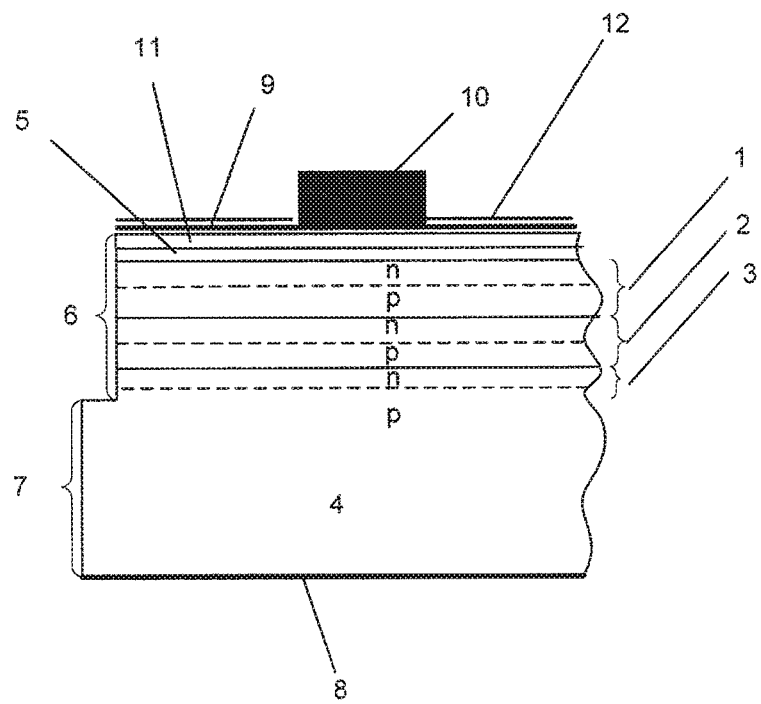
FIG. 1 shows a cross sectional view through a prior art triple junction solar cell.
Figure 2:
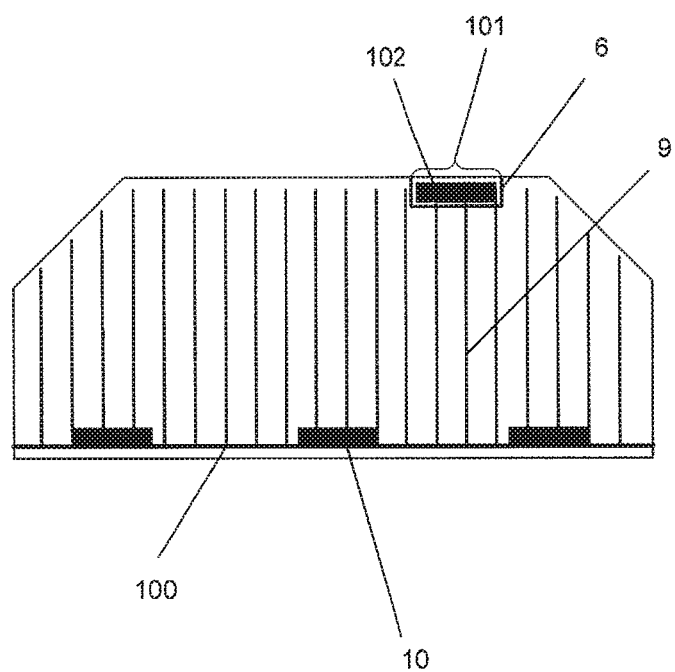
FIG. 2 shows a top view on a layout of a front side grid on the solar cell.
Figure 3:
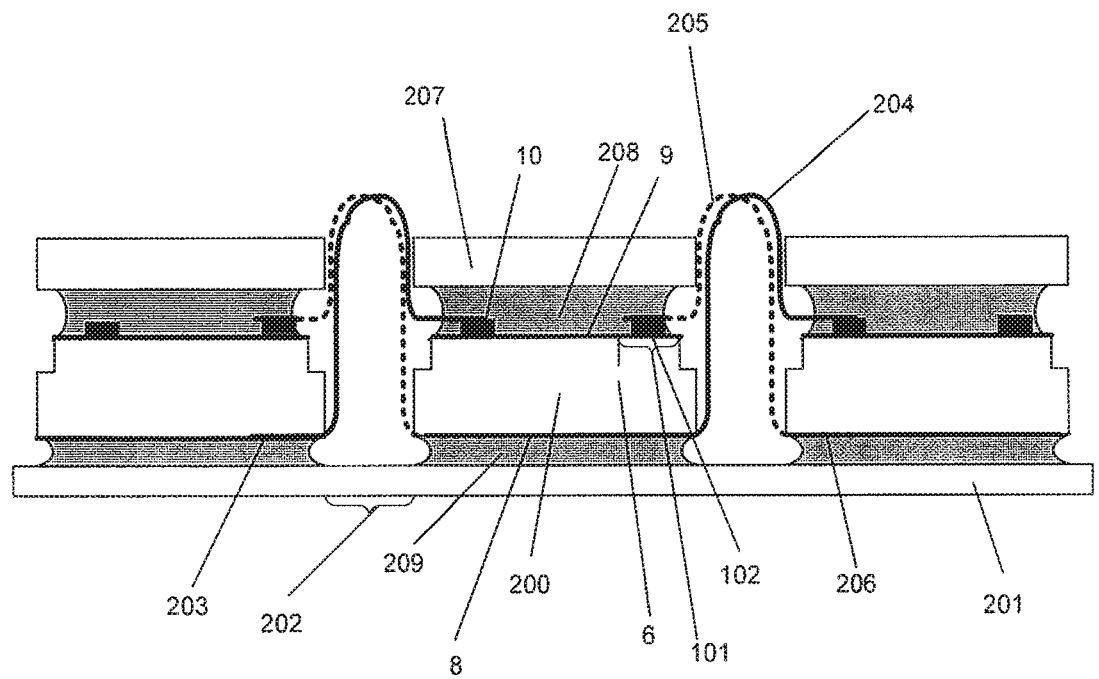
FIG. 3 shows a prior art example of interconnecting individual cells into a photovoltaic assembly for space use.

FIG. 4 illustrates the proposed technique of a solar cell C according to this invention to establish a contact point 304 of a rear side contact 8 on the cell front side. The contact point 304 is electrically connected via a rear portion 303 of the substrate 4 to the rear side contact 8 by exploiting the high conductivity of the Germanium substrate 4. The drawing is not to scale and the solar cell C shown in FIG. 4 serves illustration purposes only. The invention is in no way limited to this particular cell type or geometry. Features of the solar cell C according to the invention which resemble features of the prior art solar cell shown in FIGS. 1 and 2 have been allotted the same reference numerals and for their description reference is made to the description of FIGS. 1 and 2.

" "A front layer 1' comprising a p-n-junction 1 is provided on the front surface of the substrate 4, wherein the p-n-junction separates the front layer 1' into a front portion having the first doping n and a rear portion having the second doping p. The front layer's front portion is separated from the substrate front portion 306.

An intermediate layer 2' comprising a p-n-junction 2 is provided between said substrate 4 and said front layer 1'. The p-n-junction separates the intermediate layer 2' into a front portion having the first doping n and a rear portion having the second doping p. The intermediate layer's front portion is separated from the substrate front portion.

First electric contacts 9 are provided on the front side C' of the solar cell C in the form of grid fingers and are electrically connected to the front portion of the front layer 1'. These grid finger contacts are connected to a plurality of contact pads 10 which are disposed on a lateral side of the front surface of the solar cell C.

Second electric contact pads 304' forming the contact points 304 are provided so that they are accessible from the front side C' of the solar cell C as will be described below. These second electric contact pads 304' are electrically connected to the rear portion 303 of the substrate 4. The second electric contact pads 304' are placed on the bottom surface of a groove 305 which opens to the front side C' of the solar cell C and which extends to the rear portion 303 of the substrate 4. Groove 305 opens also to lateral side 7' of cell C.

To provide the contact groove 305 for the second, rear side contact pad 304' the epitaxy is etched at 301 to about 10 μm, whereas the width of the groove 305 forming a contact pad area 302 for the contact pad 304' of contact point 304 is a one hundred times as large. The height 7 of the remaining wafer is in the order of 100 μm.

The first element of this invention involves an efficient way to establish an independent (+) contact point 304 at the location 300 on the cell front side C' as well, next to the (−) contact pad 10 already present there. In other words, the contact which is in the prior art present on the cell rear side is moved to the front side C. This is achieved as shown in FIG. 4 by relying on the conductivity of the p doped Germanium wafer 4 itself. It has to be noted that the polarity of the contacts and the associated doping (p or n) in FIG. 4 just serves as an example. Opposite polarities are of course feasible as well.

Over a sufficiently large area 302, e.g. 8×1.2 mm$^2$, the entire epitaxy is etched away to form the groove 305 of a height 301 down to the p doped rear portion 303 of the Germanium substrate 4. The same etch processes used to establish the mesa groove 6 at the cell edge or to isolate the integrated diode can be applied here as well. The metal contact pad 304' is then deposited on the p doped rear portion 303 of the Germanium substrate 4 and serves as a contact pad for an external cell connector.

Typically the same ohmic contact pad system is used for the cell front side contact 9 and contact pad 10 (interfacing for example to the n doped Ga(In)As based cap layer) as for a cell rear side contact 8 (interfacing to the p doped Germanium). Therefore both front side contacts can also be deposited in on step on the cell front side. The Germanium substrate in state of the art triple junction cells is fairly highly doped, resulting in specific resistances in the 10 mΩcm range (Ref.: C. G. Zimmermann, Journal of Applied Physics, 100, 023714, 2006). Assuming a thickness of the Germanium wafer of 140 μm and three (+) contact pads 304' with an area of 7 mm$^2$ each, the resistance R of this current path through the Germanium wafer equates to $$R = 10 \text{ mm}\Omega\text{cm} * 140 \text{ μm}/(3*7 \text{ mm}^2) = 0.7 \text{ m}\Omega.$$

With typical cell currents around 0.5 A, this results in a negligible voltage loss below 1 mV. The high conductivity of the Germanium substrate is thus exploited to establish (+) front side contact points 304 for the rear contact 8 on the cell as the main feature of this design.

Other approaches of the prior art, for example for Si solar cells with a Si wafer of much higher resistance, require an additional conductive member at the cell edge to establish the front side contacts. Most notably this is suggested in U.S. Pat. No. 3,527,619 A. Although the cell emitter including the p-n-junction is etched away in this prior art approach as well, the sole purpose of this etching is to avoid the necessity for an additional insulating layer between the wrapped around conductive surface and the cell edge; without this etching the cell would be short circuited at the cell edge in this prior art approach.

The rear side metallization at rear side contact 8, which is typically equally thick as the front side metallization at front side contact 9 to ensure the same properties at the contact pad location, might be in addition reduced in thickness, depending on the amount of additional ohmic losses tolerable. The antireflection coating 12 in the (+) contact area 302 is optional.

With respect to the spatial arrangement of the (+) contact pad location, there is complete flexibility. In a non-rectangular cell, e.g. a cell with cropped corners, the cropped corner region can be a preferred location of the contact pads or welding pads. At these locations the possibility exists to use part of the circular wafer region unsuitable as solar cell itself for the contact pad and thus minimize the loss in additional cell area.

Figure 5:
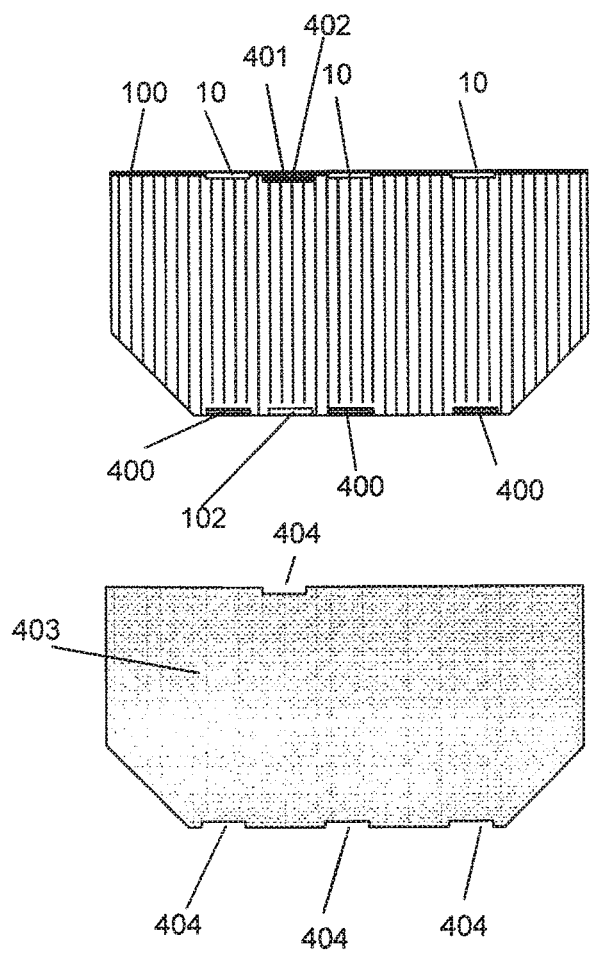
FIG. 5 shows a top view on the solar cell of FIG. 4 and on a cover glass therefore.

In FIG. 5 a spatial arrangement of the additional (+) contacts 400, 401 on the cell front side together with an adapted layout of a cover glass 403 is shown.

A more conventional placement of the (+) contacts 400 for a 8×4 cm$^2$ sized triple junction cell with flute (−) contact pads 10 and an integrated diode 102 is illustrated in FIG. 5. For interconnection of the diode of the neighboring cell, a fourth (+) contact 401 is required. Assuming that 10 mm$^2$ of active cell area are etched away for a 7 mm$^2$ contact pad, which ensures sufficient distance of the contact pad metal to the open p-n-junctions, 1.3% of the cell area is lost due to the placement of the (+) contacts on the cell front side. Of course the horizontal collecting gridline 100 has to be shaped around (see at 402) the contact pad required for the optional diode contact 401.

The cover glass 403 is adapted for this top contact solar cell design such that this cell is still compatible with the state of the art sequential manufacturing flow. As already outlined in the description of the prior art, the cells have to be protected by a cover glass to survive the radiation environment in space. For example in the geostationary orbit characterized by a high dose of low energy protons a cell would suffer severe damage within weeks if even the smallest cell area were to be left uncovered. Therefore the entire active cell area as well as the integrated diode has to be covered up to the very edge in the top contact solar cells when the cells are designated for space use. This requirement, however, does not apply to the (+) contacts on the front. Since no active cell area is present at these locations, these can remain completely uncovered.

So the basic cover glass layout in conjunction with the top contact cell design is identical to the standard cover glass geometry with additional cut-outs 404 matching exactly the location and size of the (+) contact pads 400, 401.

Figure 6:
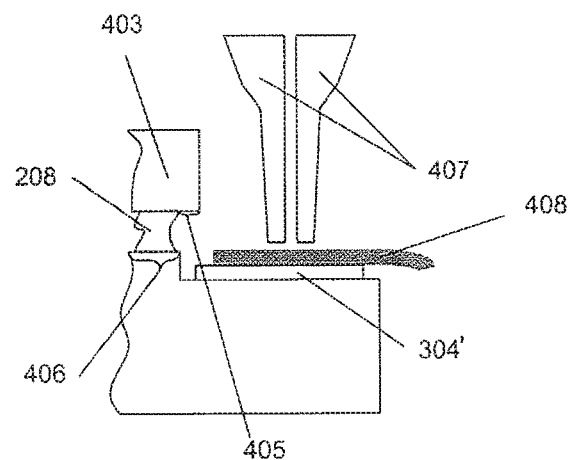
FIG. 6 shows a detailed cross sectional view through the solar cell of FIG. 4 at a contact location with a welding tool.

In FIG. 6 an enlarged detailed cross-sectional view through the solar cell is shown wherein the cover glass at a (+) contact location is illustrated. The cover glass 403 overlooks at 405 the active cell area 406 completely and thus ensures complete protection of the active cell from particle radiation. Similar as in the standard manufacturing flow outlined before, interconnectors are attached to the (−) contacts first. Then the cover glass 403 is bonded with transparent silicone adhesive 208. The cut-outs 404 leave ample space around the (+) contact pads, e.g. for welding electrodes 407 such that the (+) interconnector 408 welding can be performed after cover glass bonding.

In this way, the top or front contact cell and subsequently the top or front contact solar cell cover glass unit (CIC) is compatible with the state of the art manufacturing flow and allows for a range of design, measurement and manufacturing features of the photovoltaic assembly (PVA) that are also part of the present invention.

Figure 7:
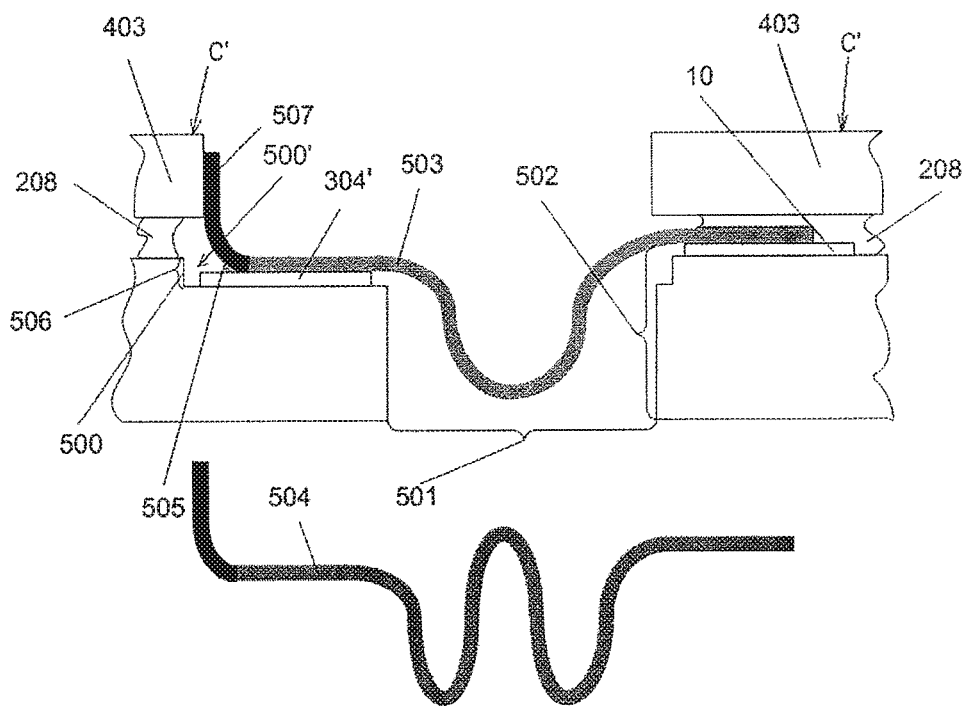
FIG. 7 shows examples of interconnector shapes of a solar cell array according to the invention.

FIG. 7 shows examples of interconnector shapes adapted to the front contact solar cell according to this invention. It is to be noted that the dimensions are not to scale: the cell to cell distance 501 is typically 5-10 times as large as the cell height 502.

Since the contact pads 304' and 10 of two adjacent cells are roughly on equal height, merely differing by the height of the epitaxy 500 that was etched away for the (+) contact, no S-shaped interconnector loop is required anymore. The shape of the thermal expansion loop can be rather confined to the space that is defined by the inter cell gap 501 (i.e. the distance between two adjacent cells in a string configuration) and the height of the cell 502. Examples for proposed shapes are a "U"-shaped interconnector geometry 503 or a "W"-shaped interconnector geometry 504 as shown in FIG. 7. Other shapes are possible which are all characterized by the fact that they have no element above the height of the solar cell 502 at all. In this way the cell to cell interconnector 503, 504 is completely protected from mechanical damage, like bending, during all solar array manufacturing and cleaning steps. This is an important advantage, since several interconnector concepts use fairly soft and thin metal foils, which are capable of surviving a large number of thermal cycles if their designed shape remains undistorted. Accidental changes in shape introduce stress concentration points that dramatically reduce the lifetime of the interconnector. The completely protected shape according to this invention thus has the potential of being able to use some shape sensitive interconnector materials for mission requiring a high number of thermal cycles.

Care has to be taken that the end 505 of the interconnector 503, 504 does not come in contact with the open p-n-junctions 506 of the cell. Therefore the end of the interconnector can be optionally bend upwards by 90° (as shown at 507) which mitigates any possibility for it to touch the p-n-junctions 506, since the interconnector is stopped by the cover glass 403 and is thus distant from the side wall of groove 500' which accommodates contact 304 like in the example of FIG. 4.

It is immediately obvious to persons skilled in the art that with this solar cell assembly design, individual solar cells as well as individual diodes can be easily measured electrically even in higher assembly stages, e.g. within a string or on a photovoltaic assembly, by placing measurement electrodes on the appropriate (+) contacts on two adjacent cells. In contrast, this is not possible in the standard prior art design where all front side contacts are covered and the rear side contacts are not accessible.

An even more important consideration is the interaction of the solar cells in a solar array with energetic ions emitted by ion thrusters used for example for attitude control of the satellite. Typically Xenon ions with energies around 100 eV are incident on the inner panels of the solar cells. The tolerance of an array to such conditions is determined above all by the erosion occurring on the solar cell interconnectors. Interruption of those separates the electrical network and results in the loss of entire strings. By confining the interconnector to the inter cell gap as outlined above, the view factor to the Xenon ions is greatly reduced and thus the critical dose of Xenon ions resulting in an unacceptable erosion of material by sputtering is increased.

Figure 8:
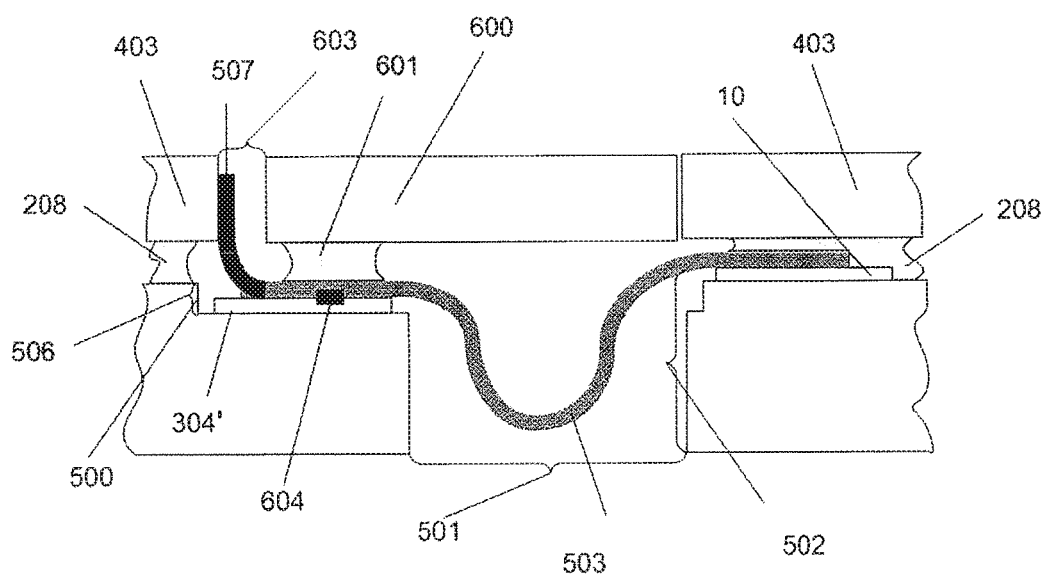
FIG. 8 shows an ion erosion protected interconnector in a solar cell array according to the invention.

A further protection is possible, as illustrated in FIG. 8, by bonding of an additional cover glass piece 600 by e.g. silicone adhesive 601 on the open (+) contact pads 304' after the interconnector 503 has been attached. This cover glass piece extends into the inter cell gap 501 and protects the interconnector 503 below from the energetic ions. The contraction of the inter cell gap 501 due to operating temperatures in orbit above the manufacturing temperature of the array is taken up by the flexible cover glass adhesive 601 and a gap 603 on the inner end of the (+) contact.

Since the attachment point 604 of interconnector 503 and contact pad 304', e.g. the weld spot, is located underneath the cover glass, the electrically relevant portion of the interconnector is protected. Due to the small dimensions of this additional cover glass piece, which is understood to cover the entire width of the interconnector, e.g. 8×2 mm, the bonding process is most convenient if it is performed in an automated way.

Figure 9:
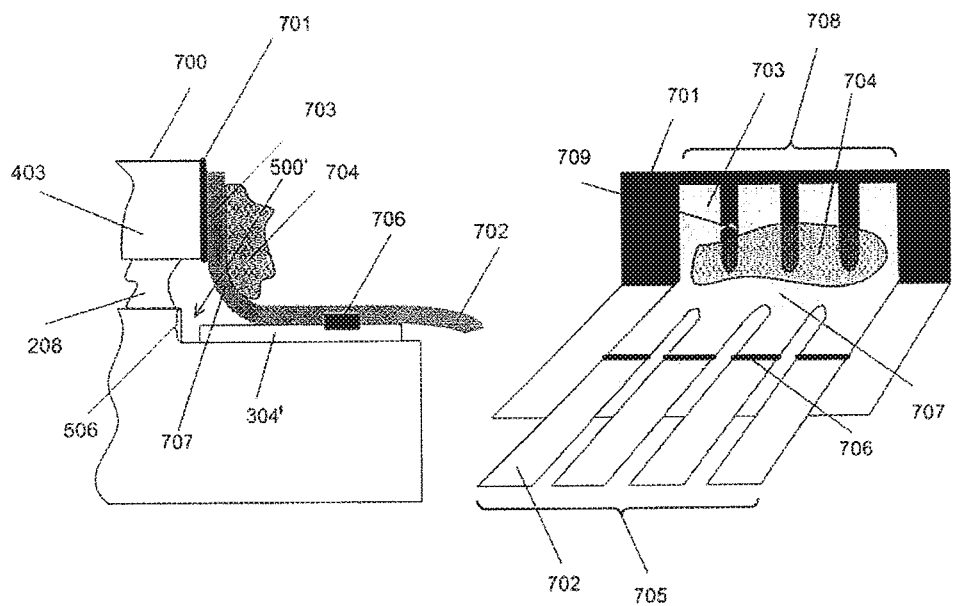
FIG. 9 shows an example of grounding conductively coated cover glasses.

In some solar array designs the front side of the cover glass has to be equipped with a conductive coating 700 as shown in FIG. 9. In state of the art cover glass designs, this conductive coating is connected to a metalized region on the cover glass side 701. The cell design of this inventive example provides a very easy grounding method of these cover glasses, if the metalized region is positioned in the cut-outs of the cover glass around the (+) contacts. Basis is the interconnector with the 90° bend 702 described with respect to FIG. 7. The upright portion 703 is connected to the metalized cover glass edge 701 by a conductive silicone adhesive 704, like the one available under the trade names NuSil CV2646 or NuSil CV1500.

The interconnector is usually not composed of a continuous sheet, but rather consists of individual grid fingers 705, which are contacted separately at a contact position 706 to the contact pad for redundancy reasons. In the area of the 90° bend 707, the interconnector becomes continuous again in the proposed design, before ending again in individual fingers 708. The space between the individual fingers 709 in the upright part of the interconnector finger allows the conductive adhesive to contact the metalized glass, whereas the continuous part in the area of the 90° bend 707 prevents the adhesive from touching and thus shorting the open p-n-junctions 506.

The solar cell assembly design with the (+) contacts on the front has in addition the advantage of providing a better repair method in case a solar cell has to be replaced within a string of solar cells due to cell damage. The solar cells in a string are bonded with silicone adhesive 800 to the carbon fiber support structure 801. In case of damage to one solar cell 802, this cell has to be removed and replaced by a new one. In the prior art this is can only be achieved by welding the interconnectors of the replacement solar cell to the interconnectors of the two neighboring solar cells of the solar cell assembly. While this repair method is still compatible with the new design, the top contact solar cell has the possibility of an improved repair method in which the interconnector is not affected by the repair process at all.

This has the advantage, in contrast to the prior art, that its fatigue behavior is not changed.

Figure 10:
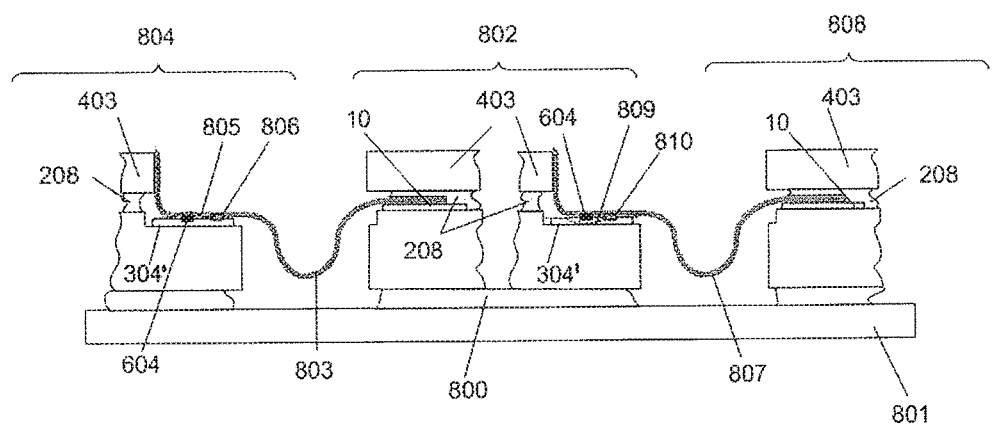
FIG. 10 is an illustration of a cell repair process for a solar cell assembly possible in conjunction with solar cell according to the invention.

This repair process which is enabled by the inventive design of the solar cells and solar cell assemblies is illustrated in FIG. 10. The interconnector 803 is removed from the (+) contact of the cell 804 to the left by separating the original contact section 604 from the contact pad 304' as is shown at 805. Care is taken in this case, that the contact pad 304' is not damaged, i.e. that all damage is contained in the interconnector 803 which is not required anymore. Once a new solar cell has been bonded to the structure instead of solar cell 802, its interconnector is again welded to the contact pad 304' of cell 804 at a slightly offset location 806.

The interconnector 807 to the solar cell 808 to the right is removed in a similar fashion from the contact pad 304' of cell 802 as is shown at 809. In this case, however, care is taken during separating the original contact section 604 to contain all damage in the contact pad 304' and not in the interconnector 807. Once the new solar cell has been bonded at the location of solar cell 802, the interconnector 807 is welded to the contact pad 304' of the replacement cell at a slightly offset location 810.

In this way, the electrically active part of the left hand side interconnector 803 and the right hand side interconnector 807 remain completely unaffected by the repair process. The only prerequisite of this repair method is that silicone adhesive 800 is present underneath the location of the respective contact pads of solar cell 802 and solar cell 804 to support the cell during the contacting (e.g. welding) operation.

As outlined previously, the interconnection of single CICs into a string is hard to fully automate in the prior art, since the CICs have to be turned upside down and the interconnectors have to be placed at the respective rear side positions. In the frame of the present invention, the CICs can be placed directly onto a suitable positioning plate 900, on which the exact cell positions are marked by appropriate grooves 901 or similar fixations.

Figure 11:
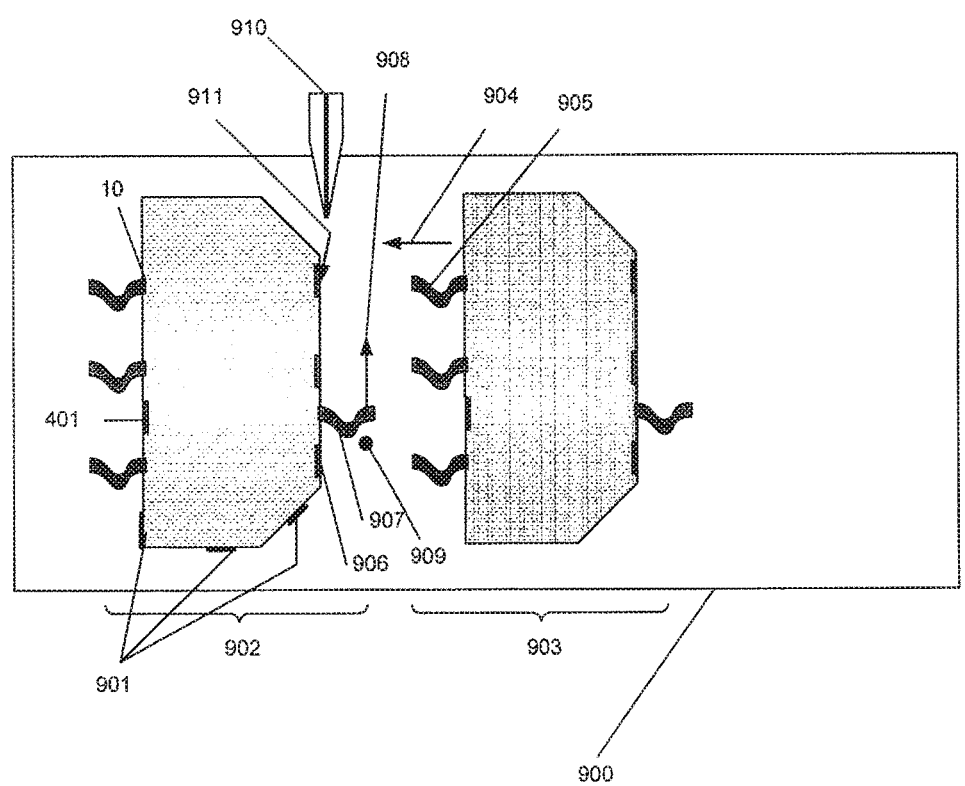
FIG. 11 shows an example of an automated string manufacturing process for a solar cell assembly according to the invention.

As illustrated in FIG. 11, a CIC 902 is laterally positioned. The next CIC 903 in a solar cell array of string form is automatically placed (arrow 904) at its position which simultaneously places its interconnectors 905 at the correct welding pad position 906 of the CIC 902. Merely the diode interconnector 907 of CIC 902 has to be temporarily moved out of the way (arrow 908) during the placement of CIC 903. This can be accomplished easily by compressed air (nozzle 909) or any other device that bends the diode interconnector 907 upwards. The contacting of the CICs e.g. by welding with welding electrodes 910, can then also be performed automatically.

The welding electrodes 910 can in addition serve to fine adjust the interconnector positions automatically (arrow 911) with the help of a camera based technique (machine vision). The positioning foil is then placed on top of the string and the further solar cell array manufacturing process continues.

Figure 12:
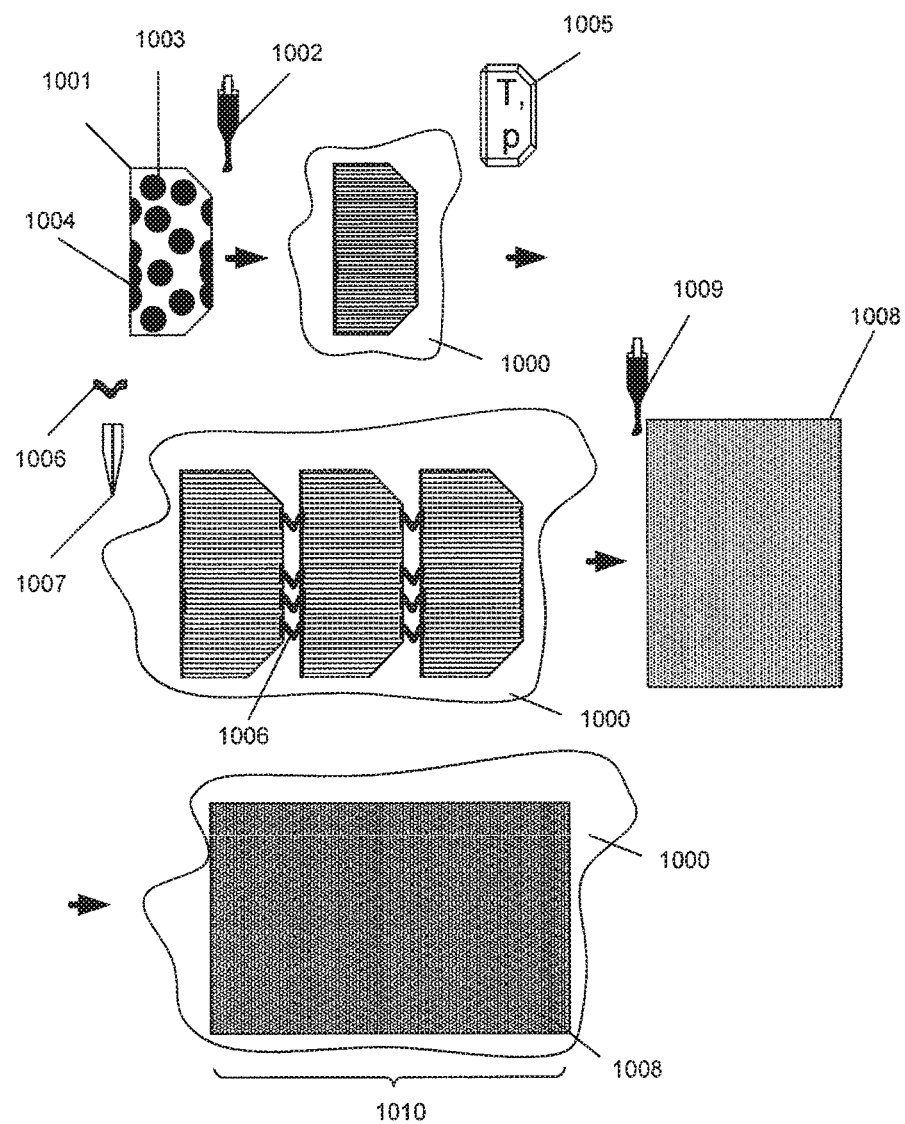
FIG. 12 shows a one step integration process for a solar cell assembly according to the invention.

Finally the top contact solar cell opens up the possibility to integrate the solar cell array in one step by an automated manufacturing sequence directly on a support structure 1000, e.g. the carbon fiber/honeycomb panel as shown in FIG. 12.

In this manufacturing flow, silicone adhesive is first applied on the rear side of the individual solar cells 1001, preferably by a dispense technique with dispenser 1002. This technique together with room temperature vulcanizing silicone adhesives (RTVs) which are typically used in solar arrays for space, is hard to apply on larger panels, since the viscosity of the adhesive changes with time and leads to vastly different adhesive conditions during lay down of the first compared to the last string on an large area solar array panel. Applied to single solar cells, however, these problems do not arise.

The adhesive pattern 1003 can have any shape, however, an advantageous requirement here is that adhesive is present underneath all front side contact pad locations 1004. The solar cells 1001 are turned upside down and automatically placed onto the structure 1000, and a suitable device, e.g. a metal stamp 1005, cures the adhesive underneath by applying pressure as well as temperature. Typical conditions are T<100° C., for less than 1 min and pressures of less than one bar.

As soon as there are two solar cells present on the panel, the interconnectors 1006 are placed between the solar cells and welded, e.g. by welding electrodes 1007, to the contact pads. Finally the cover glasses 1008 are bonded to the cells, again after the adhesive has been applied onto it, e.g. with a dispenser 1009. The adhesive can thus be applied by a dispense technique as well, however, it has to be applied as continuous layer in the active region of the solar cell and has to be free of voids in order to minimize transmission losses. In particular this manufacturing method allows covering a plurality of cells 1010 at once with the same, large area cover glass.

Optionally, only the adhesive spots 1004 underneath the front side contact pads can be cured first. The interconnection 1006 to the nearest neighbor solar cells is performed subsequently. By placing a contact probe on two front side contact pads of opposite polarity, a check of the mechanical and electrical integrity of the solar cell and the diode is performed, e.g. by electroluminescence imaging and light I-V measurement. Only then the remaining adhesive 1003 is cured thereafter. This has the advantage that the cell can be easier removed in case damage to the cell has been detected, e.g. caused by the welding operation.

The present invention thus provides a top contact solar cell. The provision of an electrical contact, originally in the prior art present on the cell rear side, is placed on the cell front side. This inventive technique is suitable for all multijunction solar cells, having several p-n-junctions stacked on top of each other and a bottom junction of sufficient mechanical stability and conductivity. The rear side contact is established by etching away on a localized area all p-n-junctions, including the emitter of the bottom p-n-junction. The basis of the bottom cell is then equipped with an ohmic contact and establishes a conductive path between cell rear side and front side.

The top contact solar cell can be equipped with a cover glass having cut outs around the contacts of the rear side doping provided on the front side of the cell. With these solar cells with integrated cover and interconnectors a solar cell assembly can be manufactured in a manufacturing process which is compatible with the photovoltaic assembly manufacturing processes of the prior arts that existing machinery can be used also with the solar cells according to the invention.

Reference numerals in the claims and in the description are provided only for better understanding the invention and shall not limit the scope of the invention which is defined by the claims only.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A solar cell assembly including at least two interconnectable solar cells, wherein:
   each said at least two interconnectable solar cell comprising:
      a semiconductor substrate having a substrate front surface and a substrate rear surface;
      a first p-n-junction provided in the substrate close to and below the substrate front surface, the first p-n-junction separating the substrate into a substrate front portion having a first doping and a substrate rear portion having a second doping;
      a front layer comprising a further p-n-junction provided on the substrate front surface of the substrate, the further p-n-junction separating the front layer into a further front portion having the first doping and a further rear portion having the second doping, the further front portion being separated from the substrate front portion;
      at least one first electric contact being provided on a front side of the solar cell that is electrically connected to the further front portion;
      at least one second electric contact being provided on a rear side of the solar cell that is electrically connected to at least one contact point provided on the front side of the solar cell;
      the at least one contact point being placed on a bottom surface of a groove formed in the substrate that opens to the front side of the solar cell and which extends to the substrate rear portion;
      an electrical connection between the at least one second electric contact and the at least one contact point being provided by the substrate rear portion; and
      a cover glass being provided on a front surface of the front layer of each said solar cell, wherein each said cover glass is provided with cut-outs located at positions of the at least one contact point;
   the solar cell assembly comprising:
      the at least two solar cells arranged adjacent each other to form a row of solar cells, the at least two solar cells comprising at least a first and a second solar cell;
      first and second electric contact pads for respective first and second electric contacts for each solar cell, wherein a first electric contact pad of the first solar cell is positioned adjacent to a second electric contact pad of the second solar cell and a second electric contact pad of the first solar cell is positioned adjacent to a first electric contact pad of the second solar cell; and
      interconnectors being arranged to connect each first electric contact pad of the first solar cell with the adjacent second electric contact pad of the second solar cell and to connect each second electric contact pad of the first solar cell with the adjacent first electric contact pad of the second solar cell, wherein each interconnector is sized so that, between the adjacent first solar cell and the second solar cell, the interconnector is located below a height of the first electric contact pad and overlies or extends into an inter cell gap, wherein each interconnector is provided with a cover member covering a front surface of the interconnector, wherein the cover member is mounted to the interconnector with a flexible adhesive, and the cover member is a cover glass piece, and wherein the cover member and the cover glass comprise separate members that are separated from each other by a gap adapted to take up, along with the flexible adhesive, contraction of the inter cell gap.

2. The solar cell assembly according to claim 1, further comprising at least one intermediate layer comprising an intermediate p-n-junction provided between the substrate and the front layer, the intermediate p-n-junction separating the at least one intermediate layer into an intermediate front portion having the first doping and an intermediate rear portion having the second doping, the intermediate front portion being separated from the substrate front portion.

3. The solar cell assembly according to claim 1, wherein the groove is provided on and opens to a lateral side of the solar cell.

4. The solar cell assembly according to claim 1, further comprising at least one of:

an antireflection coating at least partially provided on a front surface of the front layer; and the second electric contact pad being located at the at least one contact point on the bottom surface of the groove, the bottom surface having an antireflection coating at least partially around the at least one contact pad.

5. The solar cell assembly according to claim 1, wherein the solar cell is a III-V triple junction cell and the substrate is a Germanium wafer.

6. The solar cell assembly according to claim 1, wherein the cut-outs have a same size as the second electric contact pad forming the at least one contact point.

7. The solar cell assembly according to claim 1, wherein the interconnectors are formed in a U-shaped or a W-shaped configuration, wherein at least one free end of the interconnector extending from a connection to one of the first or second electric contact pad is bent upwardly away from the one first or second electric contact pad and spaced from a sidewall of the groove, and wherein each interconnector comprises a plurality of grid fingers, each of which is contacted separately to the associated electric contact pad.

8. A solar cell assembly of at least three interconnectable solar cells, wherein:

each said at least three interconnectable solar cell comprising:

a semiconductor substrate having a substrate front surface and a substrate rear surface;

a first p-n-junction provided in the substrate close to and below the substrate front surface, the first p-n-junction separating the substrate into a substrate front portion having a first doping and a substrate rear portion having a second doping;

a front layer comprising a further p-n-junction provided on the substrate front surface of the substrate, the further p-n-junction separating the front layer into a further front portion having the first doping and a further rear portion having the second doping, the further front portion being separated from the substrate front portion;

at least one first electric contact being provided on a front side of the solar cell that is electrically connected to the further front portion;

at least one second electric contact being provided on a rear side of the solar cell that is electrically connected to at least one contact point provided on the front side of the solar cell;

the at least one contact point being placed on a bottom surface of a groove formed in the substrate that opens to the front side of the solar cell and which extends to the substrate rear portion;

an electrical connection between the at least one second electric contact and the at least one contact point being provided by the substrate rear portion; and a cover glass being provided on a front surface of the front layer of each said solar cell, wherein each said cover glass is provided with cut-outs located at positions of the at least one contact point;

the solar cell assembly comprising:

the at least three interconnectable solar cells being arranged to form an array of solar cells;

first and second electric contacts pads for respective first and second electric contacts for each of the at least three solar cells, wherein a first electric contact pad of one solar cell is positioned adjacent to a second electric contact pad of another solar cell and a second electric contact pad of the one solar cell is positioned adjacent to a first electric contact pad of the another solar cell;

interconnectors being arranged to connect each first electric contact pad of the one solar cell with the adjacent second electric contact pad of the another solar cell and to connect each second electric contact pad of the one solar cell with the adjacent first electric contact pad of the another solar cell, wherein each interconnector is sized so that, between the adjacent one solar cell and the another solar cell, the interconnector is located below a height of the first electric contact pad and overlies or extends into an inter cell gap, wherein each interconnector is provided with a cover member covering a front surface of the interconnector, wherein each cover member is mounted to each interconnector with a flexible adhesive, and each respective cover member is a cover glass piece, and wherein the cover member and the cover glass comprise separate members that are separated from each other by a gap adapted to take up, along with the flexible adhesive, contraction of the inter cell gap.

9. The solar cell assembly according to claim 8, further comprising at least one intermediate layer comprising an intermediate p-n-junction provided between the substrate and the front layer, the intermediate p-n-junction separating the at least one intermediate layer into an intermediate front portion having the first doping and an intermediate rear portion having the second doping, the intermediate front portion being separated from the substrate front portion.

10. The solar cell assembly according to claim 8, wherein the groove is provided on and opens to a lateral side of the solar cell.

11. The solar cell assembly according to claim 8, further comprising at least one of:

an antireflection coating at least partially provided on a front surface of the front layer; and the second electric contact pad being located at the at least one contact point on the bottom surface of the groove, the bottom surface having an antireflection coating at least partially around the at least one contact pad.

12. The solar cell assembly according to claim 8, wherein the solar cell is a III-V triple junction cell and the substrate is a Germanium wafer.

13. The solar cell assembly according to claim 8, wherein the cut-outs have a same size as the second electric contact pad forming the at least one contact point.

14. The solar cell assembly according to claim 8, wherein the interconnectors are formed in a U-shaped or a W-shaped configuration, wherein at least one free end of the interconnector extending from a connection to one of the first or second electric contact pad is bent upwardly away from the one first or second electric contact pad and spaced from a sidewall of the groove, and wherein each interconnector comprises a plurality of grid fingers, each of which is contacted separately to the associated electric contact pad.

* * * * *